(12) United States Patent
Chu et al.

(10) Patent No.: US 6,969,266 B2
(45) Date of Patent: Nov. 29, 2005

(54) ADAPTER FOR CONNECTING A CHIP AND A SOCKER

(75) Inventors: Chi-Chuan Chu, Taoyuan (TW); An-Te Tseng, Taoyuan (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

(21) Appl. No.: 10/932,013

(22) Filed: Sep. 2, 2004

(65) Prior Publication Data
US 2005/0074992 A1    Apr. 7, 2005

(30) Foreign Application Priority Data
Oct. 3, 2003    (TW) .............................. 92127531 A (51) Int. Cl.[7] .............................................. H01R 12/00
(52) U.S. Cl. ........................................ 439/70; 439/892
(58) Field of Search ............................ 439/70, 71, 680, 439/525, 526

(56) References Cited

U.S. PATENT DOCUMENTS

| | | | |
|---|---|---|---|
| 4,468,072 A * | 8/1984 | Sadigh-Behzadi | 439/266 |
| 5,127,837 A * | 7/1992 | Shah et al. | 439/71 |
| 5,397,245 A * | 3/1995 | Roebuck et al. | 439/264 |
| 5,410,258 A * | 4/1995 | Bowers et al. | 324/755 |
| 5,571,027 A * | 11/1996 | Roebuck et al. | 439/264 |
| 5,596,224 A * | 1/1997 | Murphy et al. | 257/666 |
| 6,300,781 B1 * | 10/2001 | Yap et al. | 324/755 |
| 6,354,859 B1 * | 3/2002 | Barabi et al. | 439/331 |
| 6,559,665 B1 * | 5/2003 | Barabi | 324/755 |
| 6,575,766 B1 * | 6/2003 | Xie et al. | 439/70 |
| 6,644,981 B2 * | 11/2003 | Choy | 439/70 |
| 6,755,668 B2 * | 6/2004 | Copper et al. | 439/83 |
| 6,809,537 B2 * | 10/2004 | Adams | 324/755 |

* cited by examiner

Primary Examiner—P. Austin Bradley
Assistant Examiner—Phuongchi Nguyen
(74) Attorney, Agent, or Firm—Birch, Stewart, Kolasch & Birch, LLP (57) ABSTRACT

An adapter. The adapter comprises inner and outer guiding ribs for smoothly guiding the adapter into and out of a socket soldered on a circuit board without bending or breaking translation pins. This substantially enhances lifetime of the adapter and prevents damage to the internal structure of the socket holes.

10 Claims, 12 Drawing Sheets

ADAPTER FOR CONNECTING A CHIP AND A SOCKER

This Non-provisional application claims priority under 35 U.S.C. § 119(a) on Patent Application No(s). 092127531 filed in Taiwan, Republic of China on Oct. 3, 2003, the entire contents of which are hereby incorporated by reference.

BACKGROUND OF THE INVENTION

1. Field of the Invention

The present invention relates to an adapter and in particular to an adapter electrically connecting a chip and a socket.

2. Description of the Related Art

For easy assembly and replacement, certain chips are not directly soldered to circuit boards, such as CPU chips, but are inserted into a socket or slot soldered on a mother board.

Figure 19:
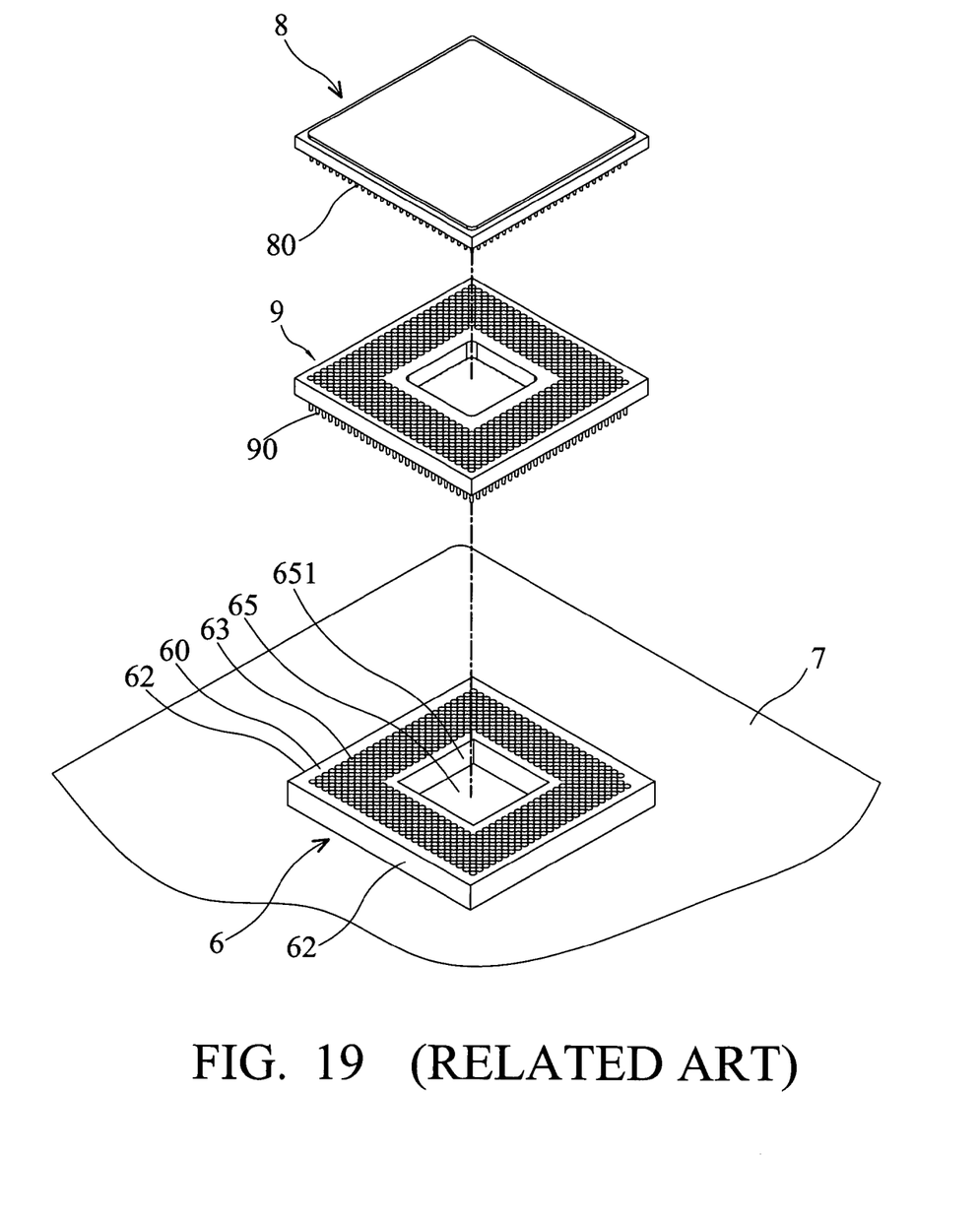
FIG. 19 is a perspective view of a conventional adapter with a chip and a socket.
Figure 20:
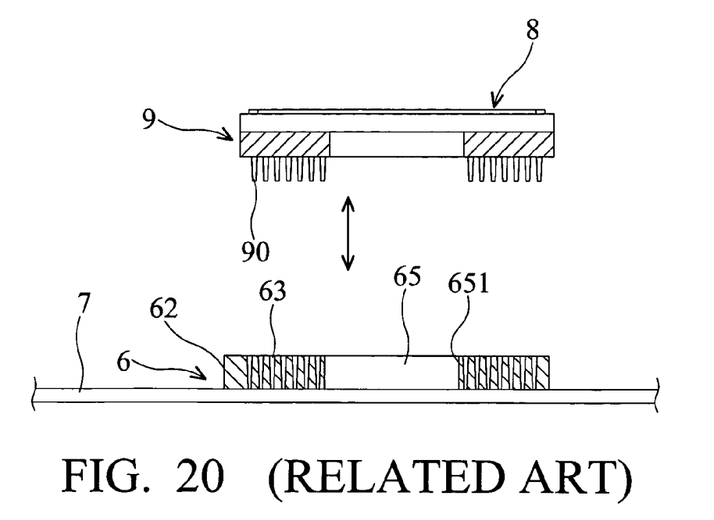
FIG. 20 shows a conventional adapter properly inserted into and removed from a socket.
Figure 21:
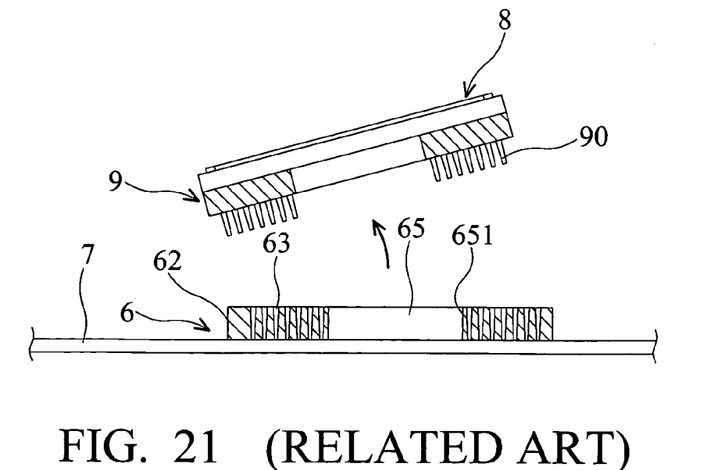
FIG. 21 shows a conventional adapter improperly inserted into and removed from a socket.

For a CPU chip with PGA package, a CPU socket with socket holes matching CPU pins is soldered onto a mother board. Such a socket as shown in FIG. 19, is referred to zero insertion force (ZIF) socket. For easy description, a rough structure of a socket 6 for CPU chip 8 is shown in FIG. 19. The socket 6 is provided with a socket top surface 60, a plurality of socket lateral surfaces 62 and a plurality of socket holes 65. The socket 6 further has a socket opening 65 provided with a plurality of flat socket opening lateral surfaces 651.

Each pin 80 of the CPU chip 8 is inserted into the corresponding socket hole 65 to electrically connecting internal circuits of the CPU chip 8 to circuits on the mother board 7. During manufacture, the CPU chip 8 is frequently inserted into and removed from the socket 6 for testing purposes. Chip pins 80 are thus easily bent or broken.

To reduce damage, the CPU chip 8 is inserted into an adapter 9 shown in FIG. 19 first, and then the adapter 9 is inserted into the socket 6. However, the adapter 9 is frequently inserted into and removed from the socket 6, as was the chip 8 previously. Obviously bent or broken pins can now occur in the adapter 9. This results in shortest life-time for the adapter 9.

Furthermore, in certain conditions, some bent pins 90 may be forced into socket holes 63, and potentially damaging the internal structure thereof.

Hence, an improved adapter is needed to resolve the problems described above.

SUMMARY OF THE INVENTION

Accordingly, an object of the invention is to provide an adapter having guiding ribs contributing to smooth insertion and removal of a socket.

In the present invention, the socket is provided with a socket top surface, a plurality of socket lateral surfaces and a plurality of socket holes arranged on the socket top surface. The adapter of the invention comprises a mounting plate having a top surface, bearing the chip, and a bottom surface, a plurality of translation pins and at least one outer guiding rib projecting from the bottom surface and contacting the socket lateral surface at two or more points to guide the adapter into the socket. Each translation pin includes a finger portion protruding from the bottom surface for insertion into the socket hole and a root portion embedded in the mounting plate, the root portion provided with a recess receiving the chip pin.

The outer guiding rib is higher than the finger portion of the translation pin, contacting the socket ahead of the finger portion, and at least two contact points are provided so that the adapter can be smoothly inserted into or removed from the socket without bending or breaking the translation pins.

Another object of the invention is to provide an adapter particularly adapted to a socket having at least one socket opening. The socket opening is provided with a plurality of socket opening lateral surfaces. The adapter comprises a mounting plate and a plurality of translation pins as described above. The adapter further comprises an inner guiding rib extending from the bottom surface and contacting the socket opening lateral surface to guide the adapter into the socket.

The inner guiding rib is higher than the finger portion of the translation pin, contacting the socket ahead of the finger portion so that the adapter can be smoothly inserted into or removed from the socket without bending or breaking the translation pins.

Another object of the invention is to provide an adapter having both the outer and the inner guiding ribs described previously to smoothly insert into and remove it from the socket without bending or breaking the translation pins.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In the preferred embodiment, while the CPU chip 8 and CPU socket 6 as shown in FIG. 19 are used to illustrate the invention, the adapter is not limited to CPU chip and CPU socket, but is also suited for use with other chips and sockets with PGA package.

Referring to FIGS. 1, 2, 3 and 4, an adapter 1 comprises a mounting plate 10 having a top surface 101 bearing the CPU chip 8 and a bottom surface 102, a plurality of translation pins 12 including a finger portion 120 and a root portion 121, an inner guiding rib 13 projecting from the bottom surface 102 to contact the socket opening lateral surface 651 to guide the adapter 1 inserted into or out of the socket 6 and an outer guiding rib 14 projecting from the edge of bottom surface 102 to contact the socket 6 for guiding the adapter 1.

Figure 3:
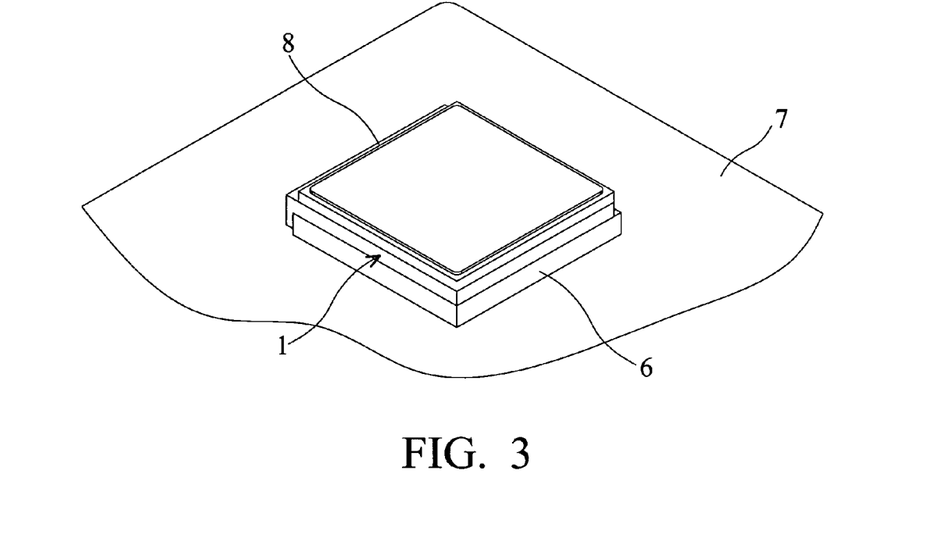
FIG. 3 is a perspective view of the adapter of the invention bearing the chip and inserted into the socket.
Figure 4:
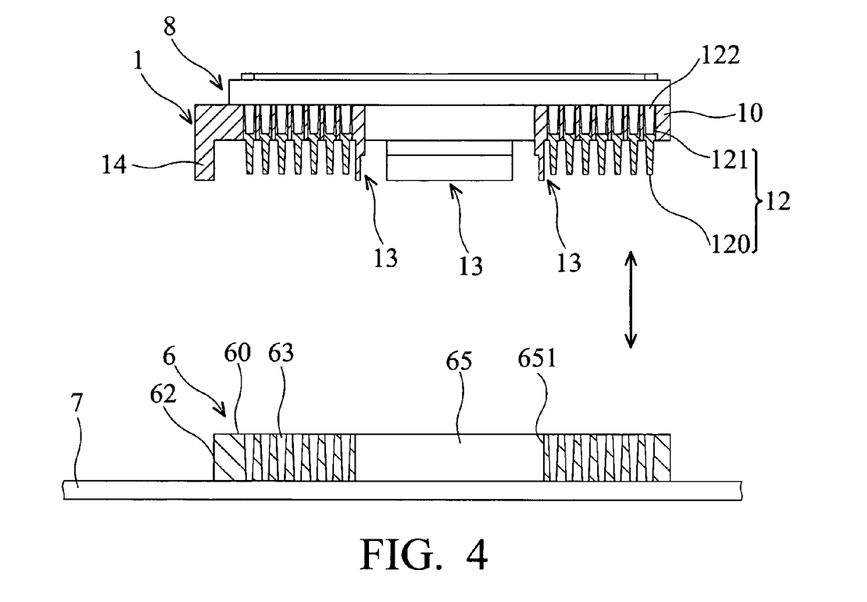
FIGS. 4, 5 are cross-sections of the adapter of the invention bearing a chip, inserted into and removed from a socket, respectively.
Figure 5:
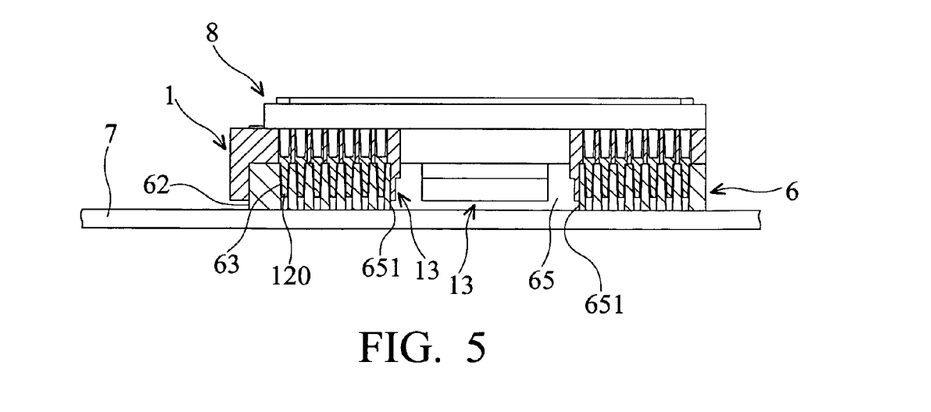

In FIG. 4, the finger portion 120 of the translation pin 12 is aligned with socket hole 63 before insertion into the socket 6. In FIGS. 3 & 5, when the adapter 1 is inserted into the socket 6, the inner guiding rib 13 is inserted into the socket opening 65 and maintains contact with the socket opening lateral surface 651 to smoothly guide the adapter 1 into socket 6 without bending or breaking the translation pin 12. When the adapter 1 is removed from the socket 6, the inner guiding rib 13 also smoothly guides the adapter 1 out.

In addition to the inner guiding rib 13, an outer guiding rib 14 is also provided, maintaining contact with the socket lateral surface 62 as the adapter 1 is inserted into and removed from the socket 6.

Thus, even if the inner guiding rib 13 is accidentally broken, the adapter 1 can still be smoothly inserted or withdrawn.

In addition, the outer guiding rib 14 is protrudes from one specific edge of the mounting plate 10 so that the adapter 1 can be inserted only when the outer guiding rib 14 matches a specific edge of the socket 6, providing real-time check function.

Figure 1:
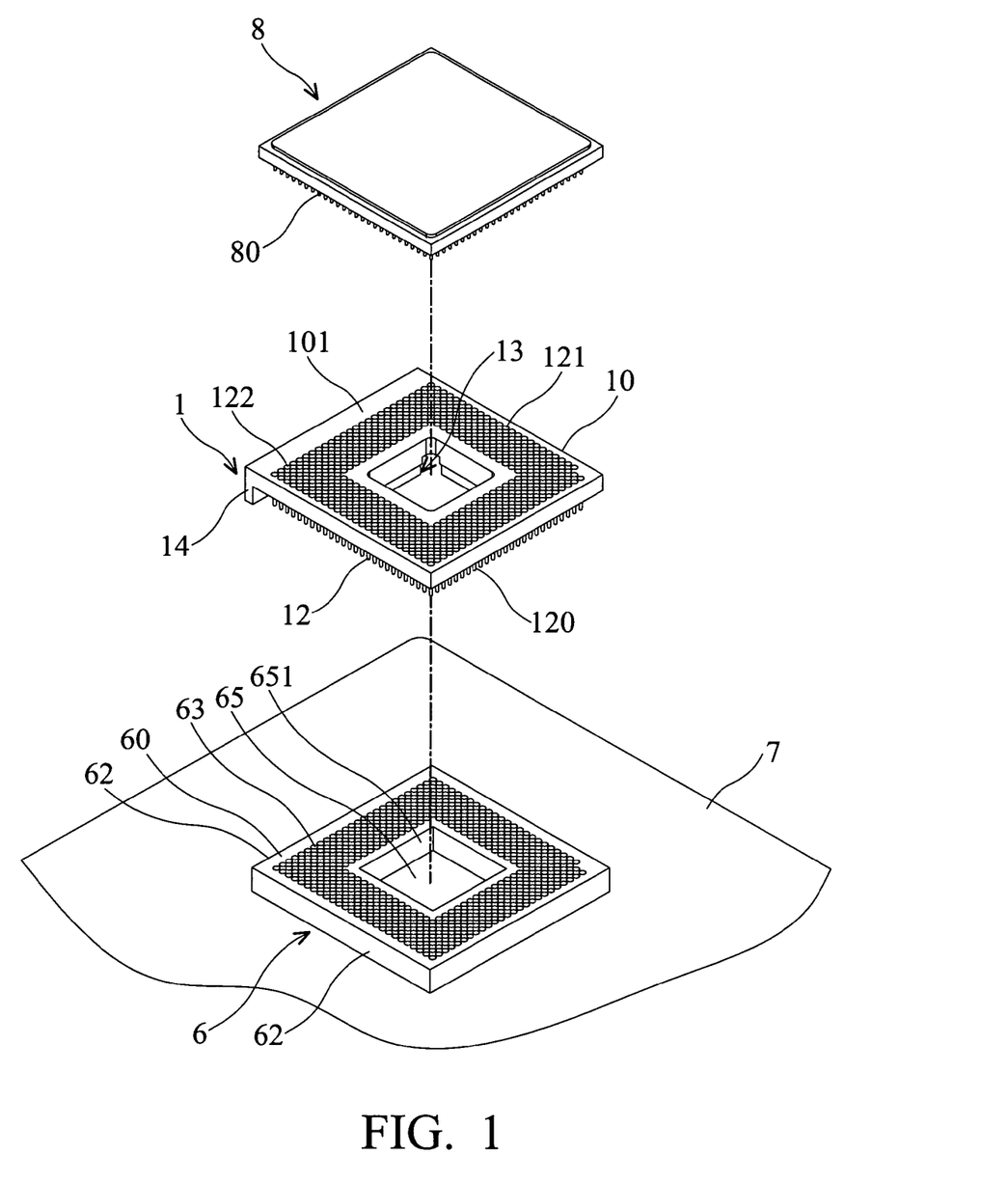
FIG. 1 is a perspective view of the adapter of the invention with a chip and a socket.
Figure 2:
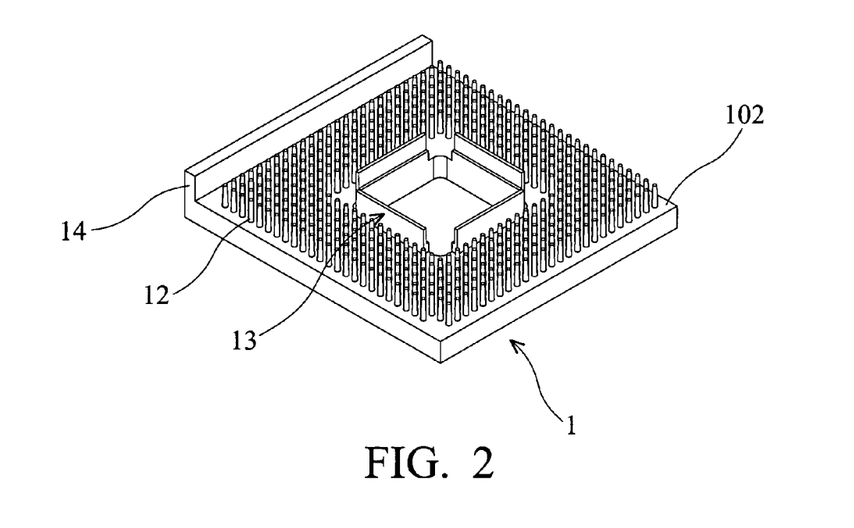
FIG. 2 is a perspective view of the adapter of the invention.

As shown in FIGS. 2, 4, since the inner and outer guiding ribs 13, 14 are higher than the finger portion 120, as long as inner guiding rib 13 abuts the socket opening lateral surface 651, or the outer guiding rib 14 abuts the socket lateral surface 62, the finger portion 120 is aligned with the socket hole 63 without touching the socket 6 preventing damage thereto.

The inner and outer guiding ribs 13, 14 of the invention ensure the adapter 1 smoothly insertion and removal of adapter 1 with socket 6 to prevent the pin 12 being bent or broken. This previously increased lifetime for the adapter 1 and prevents damage to the internal structure of the socket holes 63.

Figure 6:
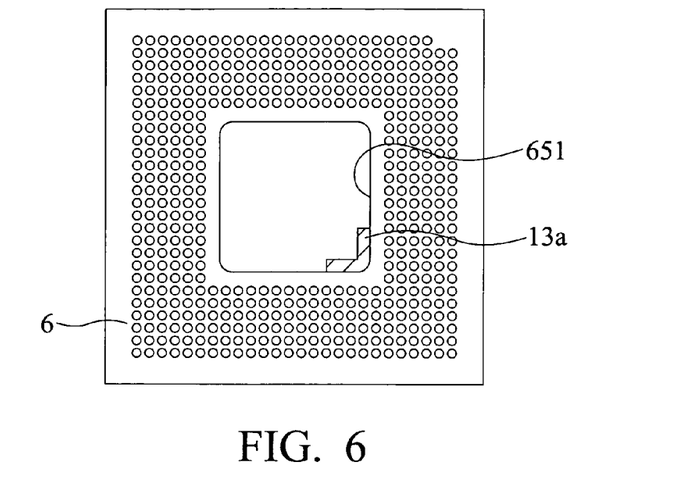
FIGS. 6–18 show various outer and inner guiding ribs.

In the embodiment described, although the inner guiding rib 13 is a cannular square post comprising four plates and the outer guiding rib 14 is a rectangular post, inner and outer guiding ribs of other shapes are also suitable as long as the inner guiding rib 13 can contact the socket opening lateral surface 651 or the outer guiding rib 14 can contact the socket lateral surface 62, for example:

As shown in FIG. 6, an L-shaped post is provided as the inner guiding rib 13a and two contact planes are available between the L-shaped post and the socket 6. More precisely, two contact planes are available between the L-shape post and the socket opening lateral surface 651.

Figure 7:
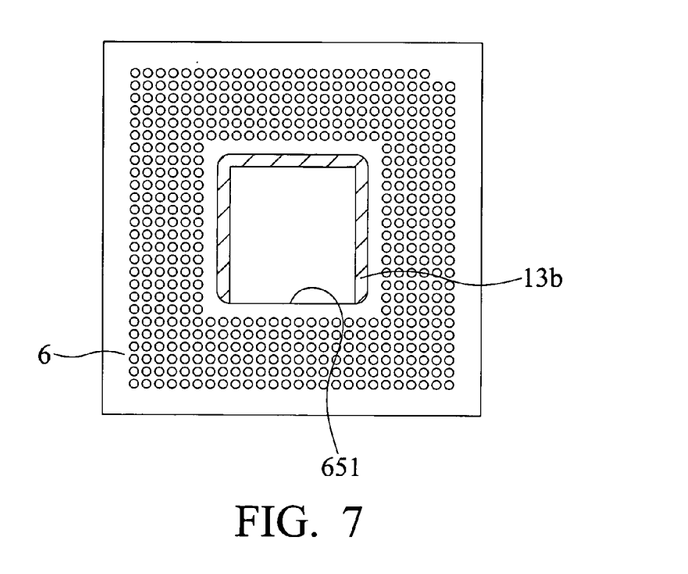

As shown in FIG. 7, a U-shaped post is provided as the inner guiding rib 13b and three contact planes are available between the U-shaped post and the socket 6. More precisely, three contact planes are available between the U-shape post and the socket opening lateral surface 651.

Figure 8:
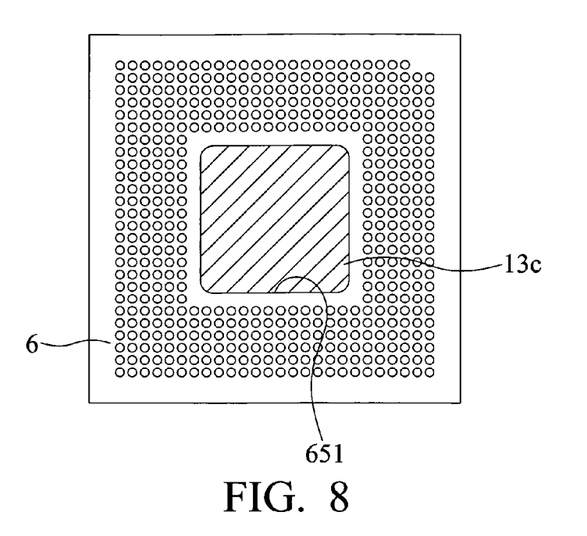

As shown in FIG. 8, a square post is provided as the inner guiding rib 13c and four contact planes are available between the square post and the socket 6. More precisely, four contact planes are available between the square post and the socket opening lateral surface 651.

Figure 9:
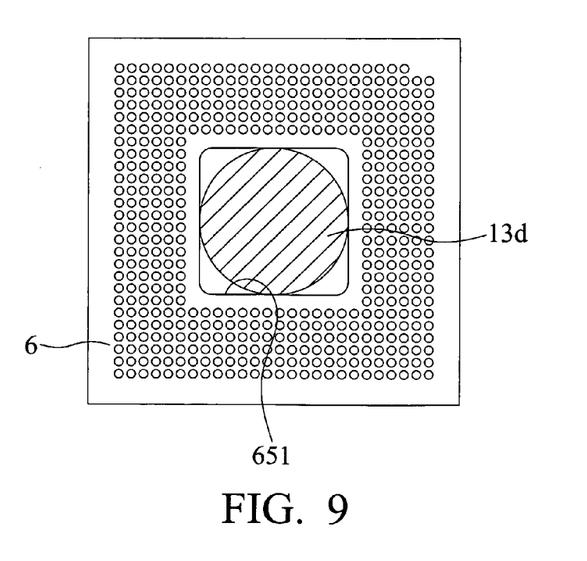

As shown in FIG. 9, a cylindrical post is provided as the inner guiding rib 13d and four contact points are available between the cylindrical post and the socket 6. More precisely, four contact points are available between the cylindrical post and the socket opening lateral surface 651.

Figure 10:
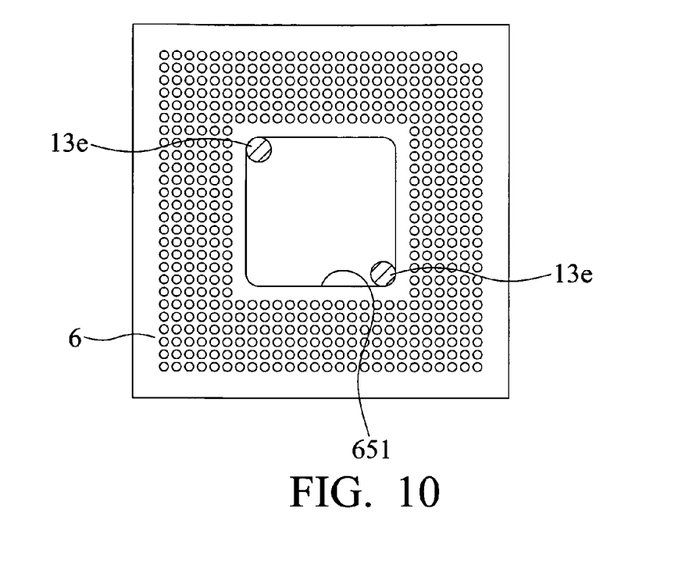

As shown in FIG. 10, two cylindrical posts are provided as the inner guiding ribs 13e, 13e and two contact points are available between the two cylindrical posts and the socket 6. More precisely, two contact points are available between the cylindrical posts and the socket opening lateral surface 651.

Figure 11:
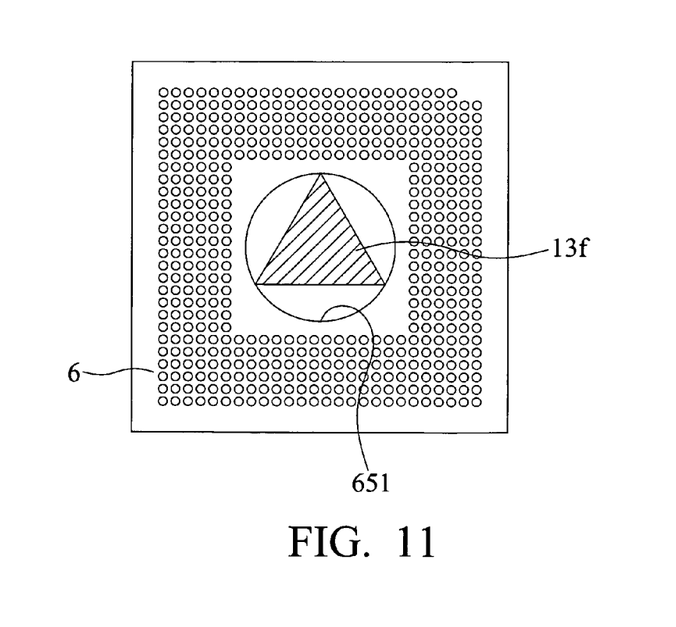

As shown in FIG. 11, a triangular post is provided as the inner guiding rib 13f and three contact points are available between the triangular post and the socket 6. More precisely, three contact points are available between the triangular post and the socket opening lateral surface 651.

Figure 12:
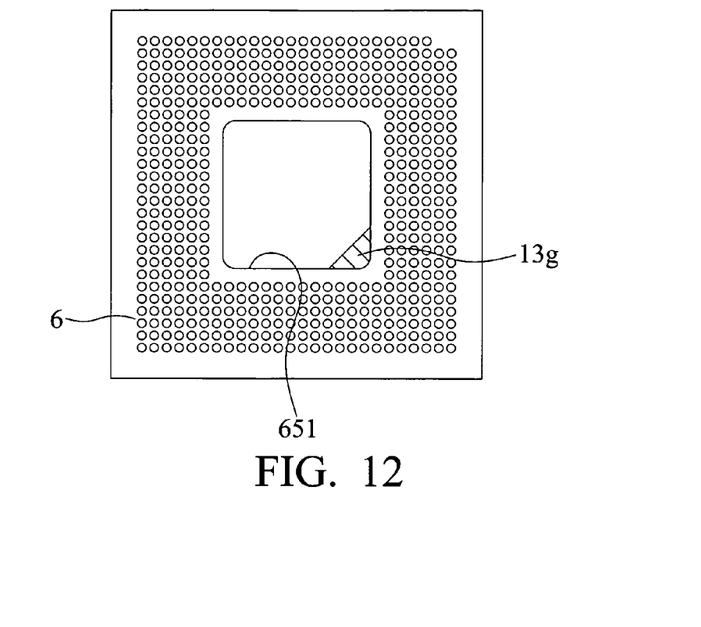

As shown in FIG. 12, another triangular post is provided as the inner guiding rib 13g and two contact planes are available between the triangular post and the socket 6. More precisely, two contact planes are available between the triangular post and the socket opening lateral surface 651.

Figure 13:
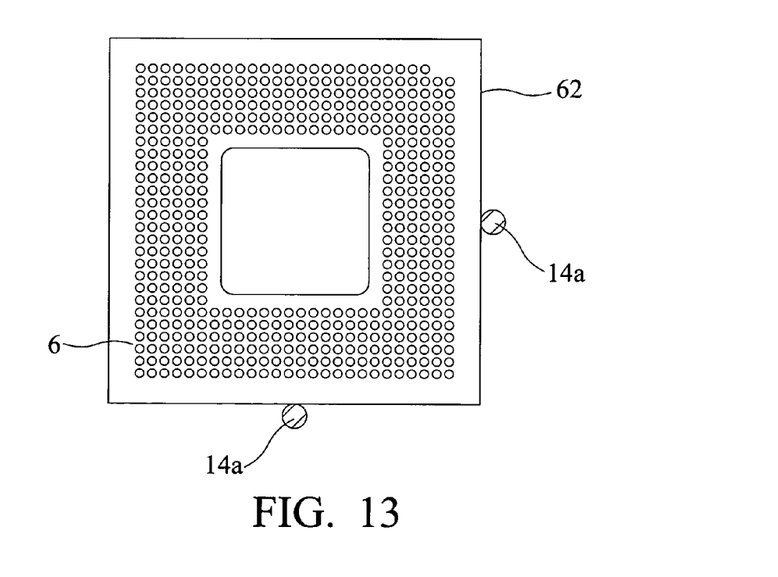

As shown in FIG. 13, two cylindrical posts are provided as the outer guiding rib 14a, 14a and two contact points are available between the two cylindrical posts and the socket 6. More precisely, two contact points are available between the two cylindrical posts and the socket lateral surface 62.

Figure 14:
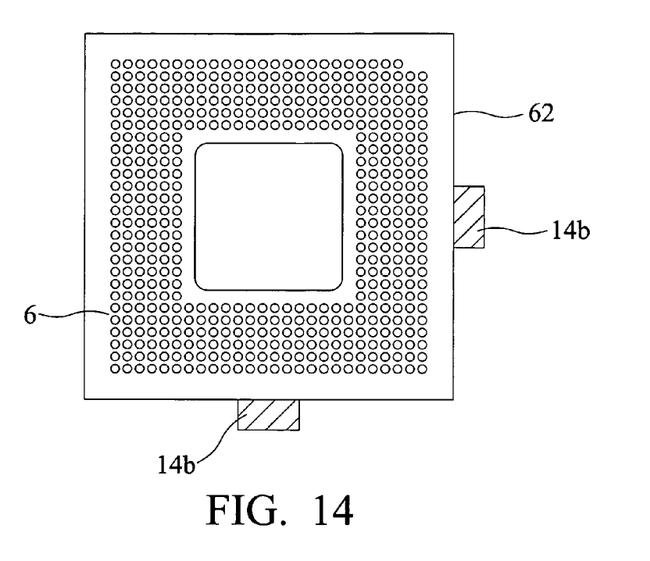

As shown in FIG. 14, two rectangular posts are provided as the outer guiding rib 14b, 14b and two contact planes are available between the two rectangular posts and the socket 6. More precisely, two contact planes are available between the two rectangular posts and the socket lateral surface 62.

Figure 15:
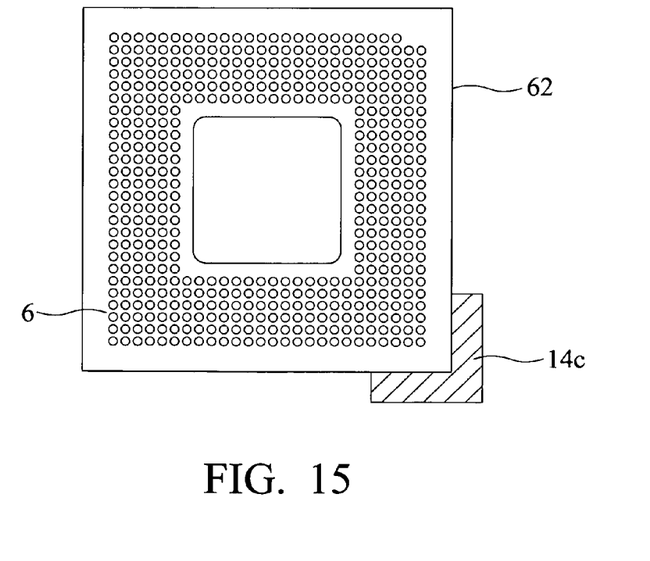

As shown in FIG. 15, an L-shaped post is provided as the outer guiding rib 14c and two contact planes are available between the L-shaped post and the socket 6. More precisely, two contact planes are available between the L-shaped post and the socket lateral surface 62.

Figure 16:
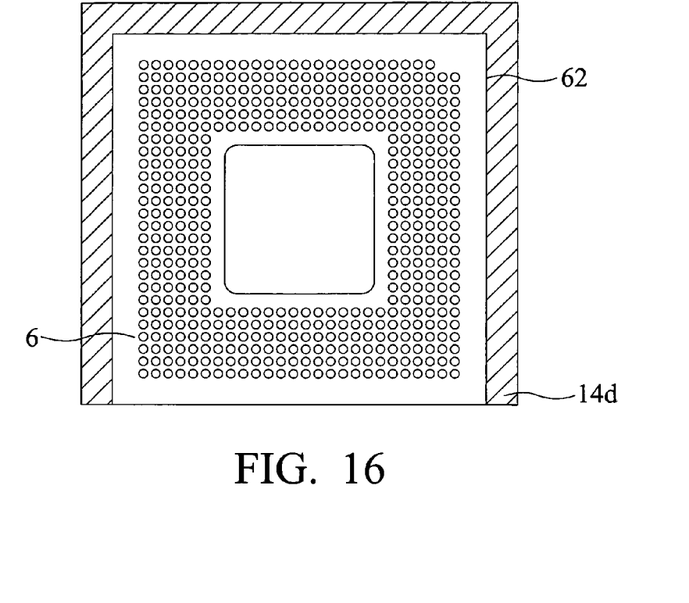

As shown in FIG. 16, a U-shaped post is provided as the outer guiding rib 14d and three contact planes are available between the U-shaped post and the socket 6. More precisely, three contact planes are available between the U-shaped post and the socket lateral surface 62.

Figure 17:
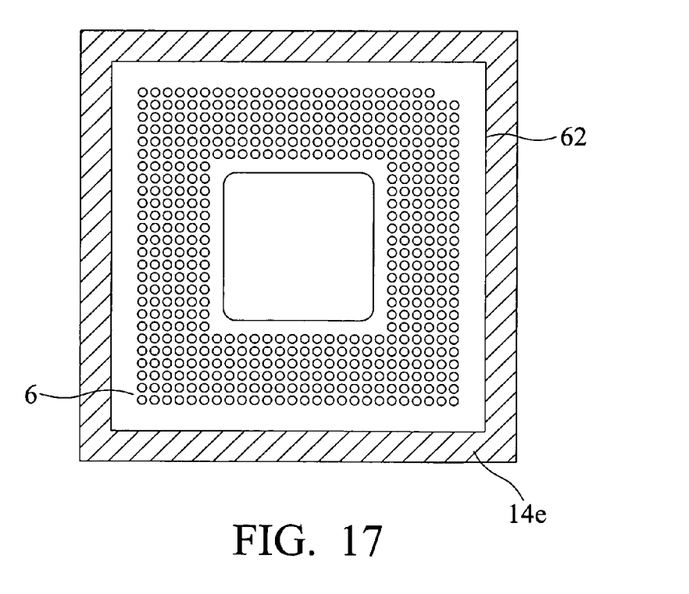

As shown in FIG. 17, a cannular square post is provided as the outer guiding rib 14e and four contact planes are available between the cannular square post and the socket 6. More precisely, four contact planes are available between the cannular square post and the socket lateral surface 62.

Figure 18:
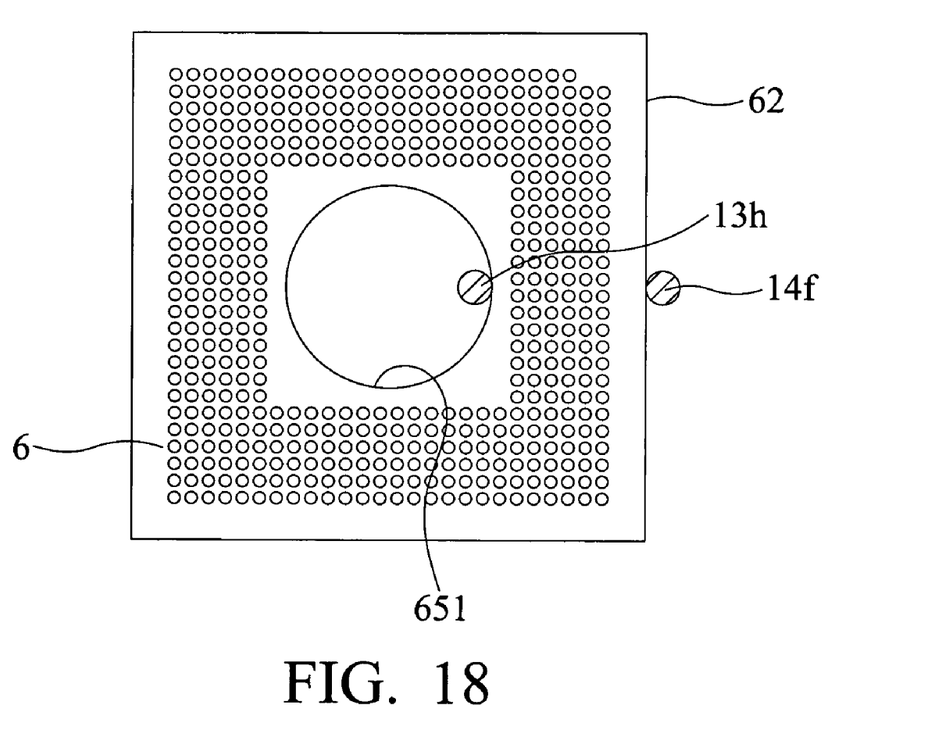

As shown in FIG. 18, a cylindrical post is provided as the inner guiding rib 13h to contact the socket 6 at one point, and another cylindrical post is provided as the outer guiding rib 14f to contact the socket 6 at one point as well.

Although the socket 6 in the embodiments described above is provided with a socket opening 65, even without the socket opening 65, the outer guiding rib 14 can alone guide the adapter 1.

In the invention, the inner and outer guiding ribs 13, 14 guide the adapter 1 inserted into and out of the socket 6 smoothly without bending or breaking the translation pins 12. This enhances lifetime of the adapter 1 and prevents damage to the internal structure of the socket holes 63.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An adapter for electrically connecting a chip having a plurality of pins to a socket having a top surface, a plurality of lateral surfaces, a plurality of holes arranged on the top surface and at least one socket opening having a plurality of lateral surfaces, the adapter comprising:

a mounting plate having a top surface bearing the chip and a bottom surface;

a plurality of translation pins including a finger portion protruding from the bottom surface for inserting into the socket hole and a root portion embedded in the mounting plate, provided with a recess for receiving the chip pin; and at least one inner guiding rib projecting from the bottom surface and contacting the socket opening lateral surface for guiding the adapter into the socket, the inner guiding rib being higher than the finger portion of the translation pin.

2. The adapter as claimed in claim 1 further comprising at least one outer guiding rib contacting the socket lateral surface at one or more points, wherein the inner guiding rib is inserted into the socket opening in such a manner that at least one contact point is provided therebetween.

3. The adapter as claimed in claim 2, wherein the at least one inner guiding rib is cylindrical and the at least one outer guiding rib is also cylindrical.

4. The adapter as claimed in claim 1, wherein the at least one inner guiding rib contacts the socket opening lateral surface at two or more points.

5. The adapter as claimed in claim 4, wherein the at least one inner guiding rib is cylindrical.

6. The adapter as claimed in claim 4, wherein the at least one inner guiding rib comprises two cylindrical posts.

7. The adapter as claimed in claim 4, wherein the at least one inner guiding rib comprises a post.

8. The adapter as claimed in claim 4, wherein the at least one inner guiding rib comprises a rectangular post.

9. The adapter as claimed in claim 4, wherein the at least one inner guiding rib is L-shaped.

10. The adapter as claimed in claim 4, wherein the at least one inner guiding rib is U-shaped.

* * * * *